United States Patent [19]

Weller et al.

[11] 4,236,126
[45] Nov. 25, 1980

[54] VARIABLE RF ATTENUATOR

[75] Inventors: Carroll Weller; Bruce Lippard, both of Cincinnati, Ohio

[73] Assignee: Cincinnati Electronics Corporation, Cincinnati, Ohio

[21] Appl. No.: 33,183

[22] Filed: Apr. 25, 1979

[51] Int. Cl.$^3$ .............................................. H03H 7/25
[52] U.S. Cl. .................................. 333/81 R; 307/237
[58] Field of Search ......................... 333/81 R, 81 A; 307/237; 323/74, 75 D, 75 F, 80

[56] References Cited

U.S. PATENT DOCUMENTS

| | | | |
|---|---|---|---|
| 3,222,609 | 12/1965 | Ulmer et al. | 333/81 R X |
| 3,529,266 | 9/1970 | King | 333/81 |
| 3,577,103 | 5/1971 | Sparks | 333/17 |
| 3,663,900 | 5/1972 | Peterson | 333/81 R |
| 3,846,724 | 11/1974 | Maier | 333/81 R |

OTHER PUBLICATIONS

Kadar, *This Voltage-Controlled rf Attenuator*, etc., Electronic Design, Jul. 22, 1971, pp. 66, 67.
Weralski, *Variable Attenuators Using p-i-n Diodes and with Stable Input Impedance*, Prace, etc., 1976, pp. 41-47.

Primary Examiner—Paul L. Gensler
Attorney, Agent, or Firm—Lowe, King, Price and Becker

[57] ABSTRACT

A variable pi RF attenuator includes shunt input and output branches, between which is connected a series branch. Each branch includes a voltage controlled variable impedance PIN diode. The level of a d.c. control input voltage is converted into a first d.c. current source having a magnitude proportional to an exponential function of the level. A first d.c. bias circuit supplies current of the first source as a d.c. bias for the series branch diode, while isolating the d.c. current of the first source from the diodes of the shunt branches. The control voltage is converted into a second d.c. current source having a magnitude proportional to the source voltage. A second d.c. bias circuit supplies current from the second source as d.c. biases for the diodes for both shunt branches, while isolating the d.c. current of the second source from the diode of the series branch.

12 Claims, 2 Drawing Figures

VARIABLE RF ATTENUATOR

FIELD OF THE INVENTION

The present invention relates generally to variable RF attenuators and more particularly to a variable RF attenuator wherein the level of a d.c. control voltage is converted into first and second d.c. current sources having magnitudes that vary in opposite directions in response to the control voltage level.

BACKGROUND OF THE INVENTION

Variable attenuators for RF signals are known. In one type of such an attenuator, a pi network includes variable impedance, voltage controlled PIN diodes in shunt input and output branches, as well as in a series branch. Generally, in the prior art circuits, a single current source supplies biasing current to all three diodes, to control the impedances of the branches. To achieve a linear db attenuation versus control voltage characteristic, in accordance with one prior art circuit, all of a linear input voltage swing is reduced to the range of the diode. Because a linear voltage across each of the diodes results in a logarithmic current variation, a linear db-voltage control is achieved. This prior art circuit reduces the normal control input voltage swing to less than one volt. Because of the relatively low voltage swing which can be applied to the diodes, the control voltage swing is at a level comparable to the amount of voltage change produced on the diodes as a function of temperature drift. Therefore, external temperature compensation circuits are generally employed.

In a second prior art circuit, wherein the diodes are driven by a single source, a piece-wise linear approximation generates antilogarithmic current characteristics as required. The use of a piece-wise linear driver to approximate an antilogarithmic function produces the desired antilogarithmic voltage output for a linearly controllable input. Each break point, however, must be precisely controlled and temperature tracked. Otherwise, the break points change as a function of temperature and proper tracking of the voltage source as a function of attenuation is generally not achieved.

In both these prior art circuits, a trade off must be made between linear operation and temperature control. Further, there is a tendency for input and output impedances of the attenuator to vary as a function of attenuation.

It is, accordingly, an object of the present invention to provide a new and improved variable RF attenuator.

Another object of the invention is to provide a new and improved variable RF pi type attenuator.

An additional object of the invention is to provide a new and improved RF attenuator having a linear db attenuation characteristic as a function of the level of a d.c. control voltage source.

An additional object of the present invention is to provide and new and improved variable RF attenuator having substantially constant characteristics over a relatively wide temperature range, e.g., minus forty degrees centigrade to plus seventy-five degrees centigrade.

An additional object of the invention is to provide a new and improved variable RF attenuator having relatively constant input and output impedance characteristics over a relatively wide range of attenuations.

An additional object of the invention is to provide a new and improved variable RF attenuator having a linear db attenuation characteristic as a function of the level of a d.c. control voltage source over a wide temperature range, and having relatively constant input and output impedances over the attenuation range.

BRIEF DESCRIPTION OF THE PREFERRED EMBODIMENT

In accordance with the present invention, the impedance of a voltage controlled PIN diode of a series branch of a pi attenuator is biased by a first d.c. current source and the impedances of voltage controlled PIN diodes in shunt input and output branches of the attenuator are controlled in response to a second d.c. current source. The amplitudes of the first and second sources vary in opposite directions in response to the amplitude of a control voltage source for the attenuation of the attenuator so that the amplitude range of the first source is much less than the amplitude range of the second source. In the preferred embodiment, the first and second current sources have magnitudes substantially equal to $K_3 + K_2 e^{-K_1 V}$ and $K_4 K_5 V$, where $K_1$, $K_2$, $K_3$, $K_4$, and $K_5$ are constants, e is the base of natural logarithms, and V is the level of a source of d.c. control voltage. The current of the exponentially related source is supplied to the diode of the series branch through a first d.c. bias circuit that isolates the d.c. current of that source from the PIN diodes of the shunt branch. A second d.c. bias circuit supplies the current of the linearly related source to the diodes of the shunt branches, while isolating the d.c. current of that source from the diode of the series branch. By utilizing relatively high impedance current sources, rather than low impedance voltage sources, temperature problems associated with low impedance semiconductor circuits are avoided. Also, by utilizing separate sources for the series and shunt diodes, relatively constant input and output impedances of the attenuator are provided over the entire attenuation range.

Preferably, the current source for deriving the exponentially related current includes an operational amplifier having input and output circuits connected together by a negative feedback path. The input circuit is responsive to a d.c. current derived from the d.c. control voltage source and includes a diode forward biased by the d.c. control source. The operational amplifier includes complementary input terminals. A resistive network couples the voltage developed across the shunt diode to one of the complementary input terminals. To assist in achieving temperature stabilization over a wide range, minus 40 degrees centigrade to plus seventy-five degrees in one configuration, a second diode is matched to and thermally coupled to the shunt diode so both diodes have substantially the same temperature characteristics. A resistor network, coupled to the voltage developed across the second diode, is connected to the other complementary input terminal of the amplifier, so that the amplifier develops an output voltage substantially equal to $K_3 + K_2 e^{-K_1 V}$ over the relatively wide temperature range. Generally, in the preferred embodiment, $K_3$ is equal to zero, but in other configurations it may have a non-zero, finite value. To control the slope of the attenuation characteristic as a function of the control voltage level, the second diode is forward biased by a d.c. source. Such forward biasing, however, may reduce the range of attenuation over which the present circuit is linear.

Preferably, the bias circuit for supplying current from the exponentially related current source to the diode of the series branch includes a resistor in series with the source and the diode of the series branch, as well as a shunt resistor for the d.c. current flowing from the diode to ground. To provide the desired insertion loss for a given voltage derived from the operational amplifier of the exponentially related current source, the values of the series and shunt resistances are designed to be greater than the impedance of the diodes in the shunt branches to a.c. current flowing from the RF source. In general, the impedances of the series and shunt resistors must remain relatively high compared to the a.c. impedance of the PIN diodes of the shunt branches to prevent loading of the RF source; typically, there must be a two order of magnitude difference between these values. To prevent the d.c. current from the exponentially related source from being coupled to the diodes of the shunt branches, a pair of d.c. blocking capacitors are connected in series with opposite terminals of the series branch diode.

The bias circuit for supplying the current of the linearly related source to the branch diodes includes a circuit for supplying the same d.c. current from the linear related source to the diodes of both shunt branches. To this end, the bias circuit includes a resistive circuit that shunts the diode of the series branch, and one of the shunt branches includes a blocking capacitor that prevents the d.c. current of the linearly related source from flowing to ground through that branch. The current from the linearly related source flows to a d.c. reference terminal through the other branch, after traversing the resistive circuit in shunt with the series branch diode. The resistive circuit shunting the series branch has a value of resistance that is adjusted to set the current through the bias path for the shunt diodes to a given output voltage level for the linearly related source for particular insertion loss conditions of the attenuator.

Connected in series with the PIN diode of each branch is a resistor. The values of the resistors in the input and output shunt branches are selected in a manner so as to linearize the RF attenuation versus control voltage characteristics of the attenuator and maintain a constant characteristic impedance for a wide range of control voltages and attenuations.

The linear characteristics are also attained by forming the linearly related current source as a bipolar emitter follower transistor having base bias resistors in series with the d.c. control voltage sources and connected to a d.c. collector supply source. The base resistors have values selected to provide a slight offset for, and to linearize, the current supplied by the linearly related souce to the diodes of the shunt branches.

In the preferred configuration, the circuit of the present invention is formed as a thin film, hybrid device. The thin film, hybrid configuration reduces the volumetric requirements of the device, as well as enabling repeatibility of results. The specific embodiment to be discussed infra is concerned with an RF frequency of 30 mHz. It is to be understood, however, that the principles of the invention are applicable to other RF regions of the spectrum, as well as microwave and millimeter wave frequencies.

It is, therefore, a further object of the invention to provide a new and improved variable RF attenuator employing PIN diodes in a pi configuration, which circuit is particularly adapted for construction as a thin film device.

DETAILED DESCRIPTION OF THE DRAWINGS

Figure 1:
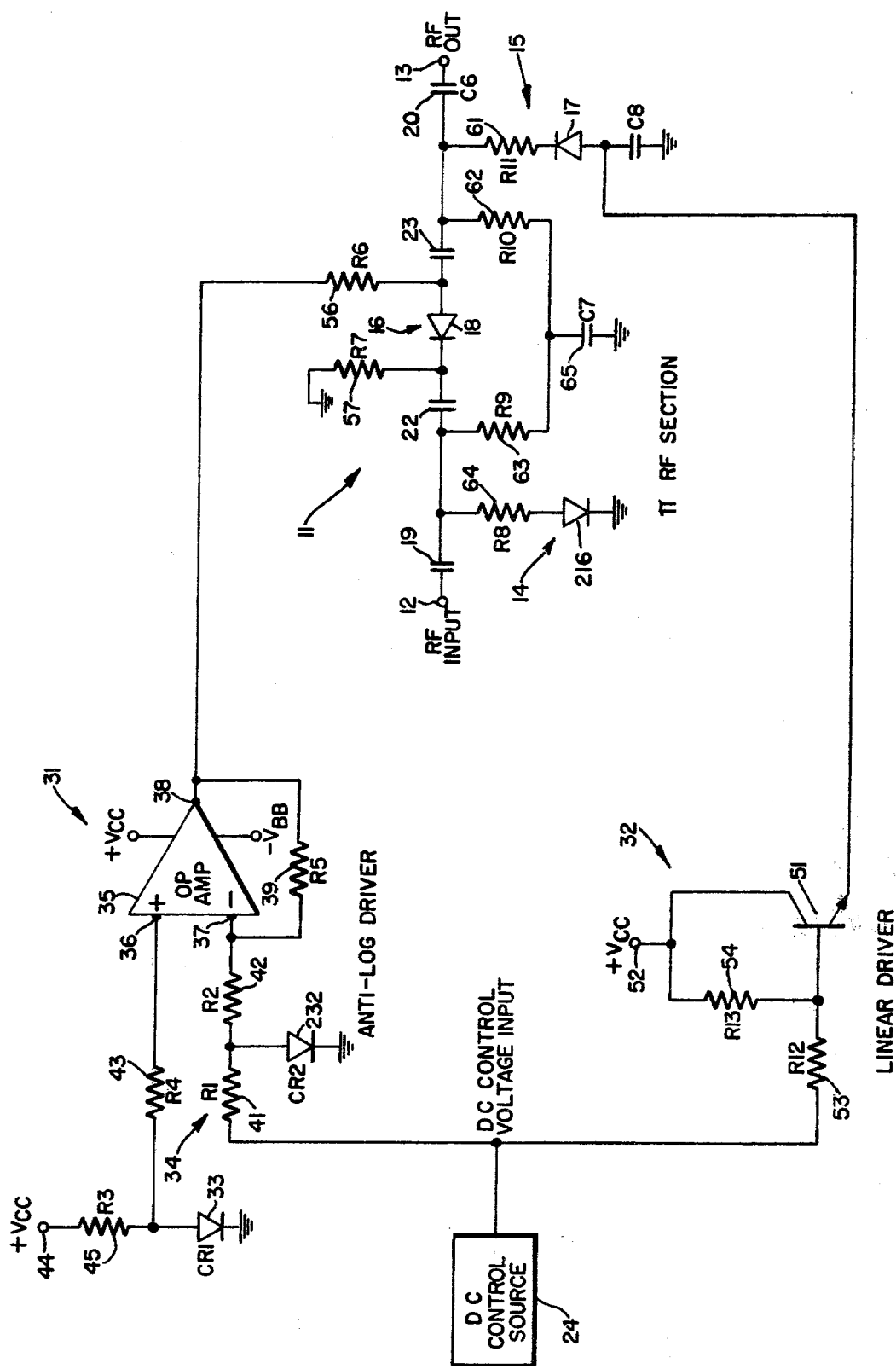
FIG. 1 is a circuit diagram of a preferred embodiment of the invention.

Reference is now made to FIG. 1 of the drawings wherein a variable attenuation, pi RF attenuator 11 is connected between an RF input terminal 12, typically responsive to a 30 mHz IF source, and an RF output terminal 13 connected to a suitable load. Attenuator 11 includes input and output shunt branches 14 and 15, respectively, as well as a series branch 16. Included in branches 14, 15 and 16 are voltage controlled variable impedance PIN diodes 216, 17 and 18. Shunt branches 14 and 15 are coupled for a.c. currents to input and output terminals 12 and 13 by capacitors 19 and 20, which prevent d.c. current that flows in the shunt branches from being coupled to the RF input and output terminals. RF current flows from terminal 12 to terminal 13 by way of capacitors 22 and 23, connected to the cathode and anode of diode 18. Capacitors 22 and 23 prevent coupling of the d.c. current flowing in diode 18 to branches 14 and 15.

Control of the impedances of diodes 216, 17 and 18 is in response to the level of a positive d.c. voltage level derived from d.c. control source 24. The voltage from source 24 is converted into first and second d.c. current sources 31, 32 respectively having magnitudes substantially equal to $K_3 + K_2 e^{-K_1 V}$ and $K_4 + K_5 V$, where e is the base of natural logarithms, $K_1, K_2, K_3, K_4,$ and $K_5,$ are predetermined constants, and V is the level of the control voltage derived from source 24. The current derived from exponentially related current source 31 is applied as a d.c. bias for diode 18, while the current derived from linearly related source 32 is applied as a bias to diodes 216 and 17. The range of exponentially related source 31 is much greater than that of linear source 32; in one embodiment, the range of source 31 causes an impedance variation of from 37 ohms to 2,800 ohms of diode 18 and the range of source 32 causes an impedance variation of 11 ohms to 100 ohms of each of diodes 17 and 216.

Exponentially related current source 31 is temperature compensated to assist in enabling the circuit of the present invention to function accurately over an extremely wide temperature range of minus forty degrees centigrade to plus seventy-five degrees centigrade. Source 31 comprises shunt P-N diodes 232 and 33 which are thermally coupled to each other so that both diodes have substantially the same temperature characteristics, a result achieved by placing both diodes in close proximity to each other on a single chip. Diodes 232 and 33 are part of input circuit 34 of operational amplifier 35 having complementary negative and positive input terminals 36 and 37, and an output circuit to which output terminal 38 is connected. A negative feedback path is established between negative input terminal 37 and output terminal 38 of amplifier 35 through resistor 39, the value of which is one of the determining factors for the gain of the operational amplifier.

Input circuit 34 includes a T network including series resistors 41 and 42. A common terminal for resistors 41 and 42 is connected to the anode of diode 232, the cathode of which is connected to ground, whereby diode 232 is forward biased by the output voltage of source 24. The other terminals of resistors 41 and 42 are respectively connected to the output terminal of source 24 and inverting input terminal 37 of amplifier 35. Shunting the non-inverting input terminal 36 of amplifier 35 is diode 33. The anode of diode 33 is connected to non-inverting input terminal 36 by resistor 43, and is forward biased by a positive d.c. voltage at terminal 44 which is coupled through resistor 45. It can be shown that the output voltage between terminal 38 and ground can be represented in accordance with the exponential equation, supra, over a relatively wide range of levels for source 24 (e.g., 0–7 volts) and over the minus forty degrees centigrade to plus seventy-five degrees centigrade temperature range. Generally, the value of $K_3$ in equation one is zero for optimum results, but in certain circumstances it may be desirable to provide a finite non-zero offset value, by suitably adjusting the d.c. voltage level at terminal 38.

The value of resistor 41 determines the initial range conditions of the circuit, i.e., the attenuation introduced in response to a zero level for control source 24. As the voltage of source 24 increases, the current through diode 232 increases with a corresponding increase in the voltage across the diode. The voltage drop across the diode 232 increases as the logarithm of the current flowing through the diode in accordance with $$V_{out} = \frac{(\log_e I - \log_e I_o)kT}{q \log_{10} e},$$

where I equals the current through diode 232 for a particular voltage level of source 24, $I_o$ equals the current through diode 232 for a zero level of source 24, $\log_e$ equals logarithms to base e, k equals Boltzmann's constant, T equals temperature in degrees Kelvin, q equals the charge of an electron, $\log_{10}$ equals logarithms to the base 10. The voltage developed across diode 232 is inverted in magnitude by the circuitry associated with operational amplifier 35, with a gain determined by the values of resistors 39 and 42. The current through diode 33 is adjusted by properly selecting the value of resistor 45 for the midrange of the current through diode 232. Because diodes 232 and 33 are matched, the temperature effects on input terminals 36 and 37 of amplifier 35 are the same and cancel. While complete cancellation does not occur because the current through diode 232 is variable, while the current through diode 33 is constant, the amount of cancellation is sufficiently great to offset the variable current effects on the voltage developed across diode 232.

Circuit 32 converts the voltage level derived from source 24 in a d.c. current in accordance with the linear equation, supra. Circuit 32 includes an NPN bipolar transistor 51 connected in an emitter follower configuration, and having a collector connected to a positive d.c. source at terminal 52. The base of transistor 51 is connected to be responsive to d.c. current derived from source 24. Base voltage for transistor 51 is provided by resistor 53, connected in series between the output terminal of source 24 and the base of the transistor, as well as by resistor 54, connected between the transistor base and collector bias terminal 52. Resistors 53 and 54 are selected to introduce an offset factor $K_4$ and to provide the desired voltage range for linear operation of the current derived from the emitter of transistor 51.

The exponentially related signal developed at output terinal 38 of amplifier 35 is supplied as a d.c. bias voltage to diode 18. To this end, output terminal 38 is connected to the anode of diode 18 by way of resistor 56, and the cathode of the diode is connected to ground by shunt resistor 57. Resistors 56 and 57 are adjusted to provide the desired attenuation insert loss between terinals 12 and 13 for a given midrange voltage level for source 24. The values of resistors 56 and 57 must remain relatively high compared to the a.c. impedance of shunt branches 14 and 15 to prevent the shunt branches from being a.c. loaded for the frequency applied to terminal 12. In general, two orders of magnitude must exist between the values of resistors 56 and 57 relative to the values for the impedances of shunt arms 14 and 15. In one particular embodiment, resistors 56 and 57 have values of three to seven kilohms and 7.5 kilohms, respectively.

The d.c. bias current supplied by the linearly related source to diodes 216 and 17 of shunt branches 14 and 15 is controlled completely separately from the d.c. bias current applied by source 31 to diode 18 of series branch 16. The current from source 32 that is applied to diodes 216 and 17 flows from the emitter of transistor 51 to the anode of diode 17 and thence to a d.c. series circuit including resistors 61, 62, 63, and 64. Resistors 61 and 64 are, respectively, part of branch circuits 15 and 14, with one terminal of resistor 61 connected to the cathode of diode 17, while one terminal of resistor 64 is connected to the anode of diode 216, the cathode of which is grounded. Resistors 62 and 63 are connected in shunt, for a.c. current from source 12, with diode 18, but d.c. current applied to these resistors is decoupled from diode 18 by blocking capacitors 22 and 23. The values of resistors 62 and 63 are selected primarily to control the d.c. current applied by source 32 to diodes 17 and 216. Resistors 62 and 63 include terminals respectively connected to a common junction for capacitor 20 and resistor 61, as well as to a common terminal for capacitor 19 and resistor 64. Resistors 62 and 63 have a common terminal which is coupled for a.c. current of the RF source, connected to terminal 12, to ground by capacitor 65. Hence, shunt paths for RF current are established by resistors 62 and 63 for terminals 13 and 12, respectively, but these shunt RF paths have high impedances relative to the impedances of input and output branches 14 and 15; to these ends, the values of resistors 62 and 63 are approximately ten times the impedances of branches 14 and 15, respectively.

The values of resistors 62 and 63 are adjusted to control the impedances of diodes 17 and 216. The values of resistors 61–64 enable the characteristic impedances between terminals 12 and 13 to remain relatively constant over the voltage range of source 24. The values of resistors 56 and 57 are selected to primarily linearize the RF attenuation characteristics of attenuator 11 between terminals 12 and 13 as a function of the voltage level of source 24. The values of resistors 61 and 64 are selected to primarily maintain a constant characteristic impedance for attenuator 11, and have secondary effects on the linearity of the attenuation characteristics of attenuator 11.

Figure 2:
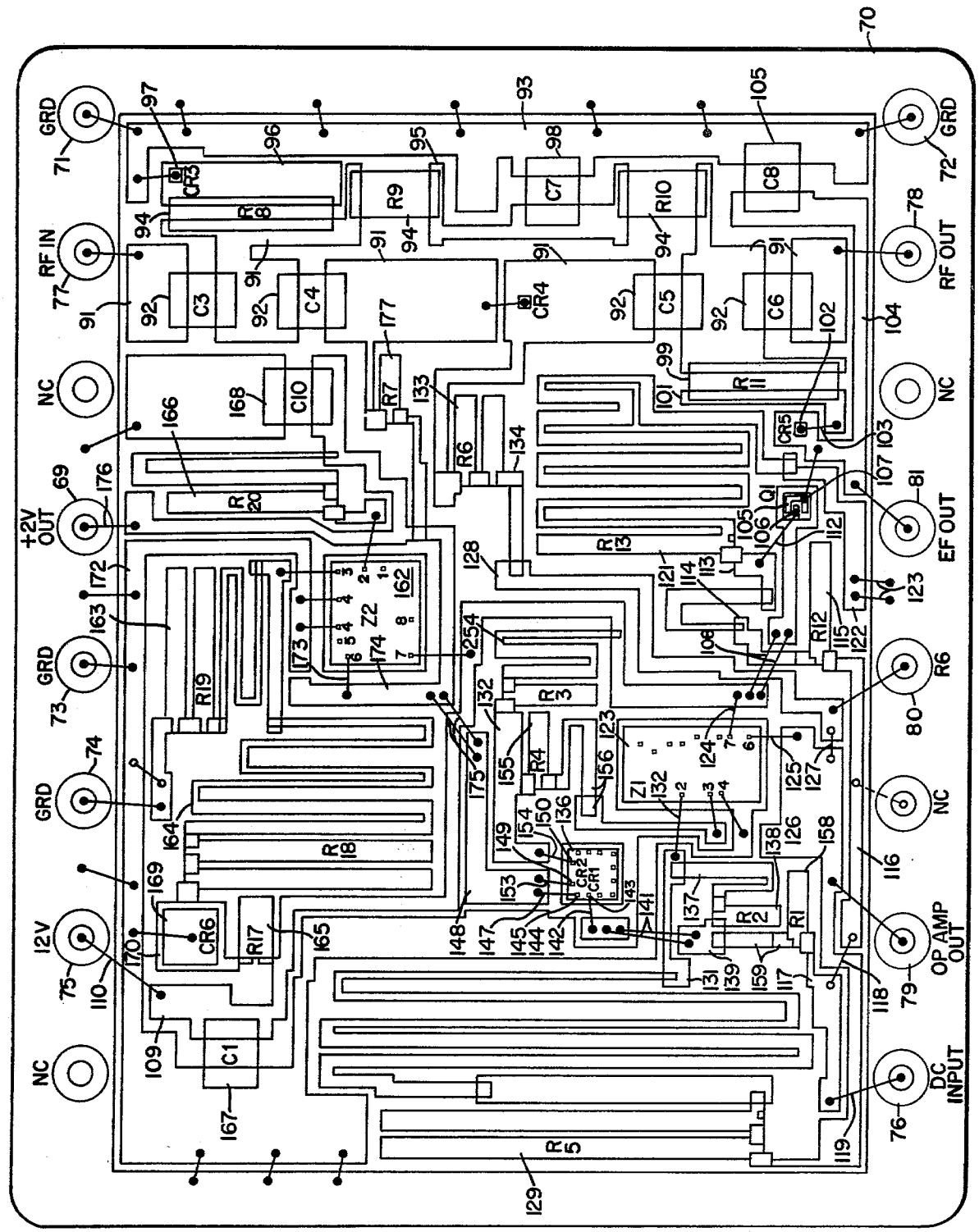
FIG. 2 is a diagram of the topography of a thin film embodiment of the invention.

Reference is now made to FIG. 2 of the drawings wherein there is illustrated the physical layout of a thin film hybrid circuit configuration of the circuit schematically illustrated in FIG. 1. The hybrid circuit is mounted on insulating substrate 70 having sixteen terminals, of which twelve are active. Of the twelve active terminals, terminals 71–74 are ground terminals, terminal 75 is a twelve volt d.c. supply terminal, terminal 76 is supplied with a d.c. input signal, and terminals 77 and 78 are provided for RF input and output signals. The remaining active terminals are for various test points, so that terminal 69 is supplied with a d.c. reference voltage by the circuit, terminal 79 is connected to output terminal 38 of operational amplifier 35, terminal 80 is connected between resistor 56 and ground, and terminal 81 is connected to the emitter of transistor 51.

The resistors, capacitors and diodes of RF attenuator 11 are elements formed on the right side, as viewed in FIG. 2 of substrate 70 that includes metallic thin film pads 91 which are capacitively coupled together by integrated circuit capacitors 92. Capacitors 92 are conventional integrated circuit structures, including a dielectric strip which is covered by a metal film. Capacitors 92 bridge gaps between adjacent surfaces of pads 91 in a straight line between RF input and output terminals 77 and 78. In close proximity to RF input and output terminals 77 and 78 are ground terminals 71 and 72, respectively. Shunt paths are provided between selected metallic pads 91 to metallic ground plane pad 93. In particular, three resistive films 94 are connected between three of pads 91 to a pair of metallic pads 95 and 96 to form resistors 62, 63 and 64. Connected to pad 96 is one terminal of a discrete integrated circuit diode 97 that forms diode 216; another terminal of circuit 97 is connected by a wire to ground plane film 93. Pad 95 is capacitively coupled to ground pad 93 by integrated circuit capacitor 98 to form capacitor 65.

Shunt output branch 18 is formed by resistive film 99 that is ohmically connected to metallic pad 91 between a pair of integrated circuit capacitors at the bottom of the right hand corner of the substrate. Resistive film 99 is connected to metallic film 101, having a tab that is connected to one terminal of diode 102 by wire 103. The other terminal of diode 102 is connected to metallic film 104 that is capacitively coupled to ground plane film 93 by capacitor 105. D.C. voltage is applied to film 104 by the emitter of transistor 51, having emitter terminal 105, base terminal 106 and collector terminal 107. Collector terminal 107 is connected to plus twelve volt terminal 75 by wires 108 and thin film metallic pad 109, in turn connected to terminal 75 by wire 110. Base terminal 106 is connected to terminal 76, responsive to d.c. control source 24, by wire 112, metallic pads 113, 114, resistive film 115, metallic films 116 and 117, as well as wires 118 and 119 which respectively bridge films 116 and 117 to each other and film 117 to terminal 76. Because of biasing problems for operational amplifier 35, resistor 34 in the hybrid thin film version is connected to ground, instead of to the supply voltage for the collector of transistor 51. To these ends, base terminal 106 of transistor 51 is also connected by wire 112 and pad 113 to resistive film 121, in turn connected to ground by metallic pad 122 and wires 123.

Operational amplifier 35 is formed by integrated circuit chip 123, having an input power supply terminal 7 connected to twelve volt d.c. power supply terminal 75 by wire 124, in turn connected to metallic pad 109, which is connected to terminal 75 by wire 110. Signal output terminal 6 of chip 123 is connected by wire 125 to metallic pad 126, in turn connected by wire 127 to metallic pad 128 and to resistive film 129 that forms feedback resistor 39. The other end of resistive film 129 is connected to metallic pad 131 which is connected to inverting input terminal 2 of chip 123 by wire 132. Metallic film 128 supplies the output signal of terminal 6 of chip 123 to resistive film 133 by way of films 134. Resistive film 133 is connected directly to one of metallic films 91 included in attenuator 11.

Inverting and non-inverting input terminals 2 and 3, respectively, of integrated circuit chip 123 are connected to separate diodes contained on a single integrated circuit chip 136. The diodes contained on chip 136 are diodes 232 and 33 in the schematic diagram of FIG. 1. To these ends, inverting input terminal 2 of integrated circuit chip 123 is connected by pad 131 to metallic pad 137, in turn connected to resistive film 138 which forms resistor 42. Resistive film 138 is connected to metallic pad 139, in turn connected by wires 141 to metallic pad 142 that is connected to terminal 143 on chip 136 by wire 144. Terminal 143 represents the anode of diode 232, the cathode of which is at terminal 145 on chip 136; the latter terminal being connected by wire 147 to metallic pad 148. The other diode on integrated circuit chip 136 includes terminals 149 and 150, respectively connected to metallic pads 148 and 152 by wires 153 and 154. Because diodes 232 and 33 are mounted on the same integrated circuit chip, temperature variations of both diodes are virtually the same and the temperature voltage characteristics of the diodes remain the same relative to each other.

Bias voltage for terminal 150 of diode 33 is provided by a positive d.c. voltage supplied to resistive film 254, that forms resistor 45. Opposite ends of film 254 are connected to films 152 and 109, the latter being connected to the plus twelve volt d.c. supply at terminal 75 by wire 110. The d.c. voltage at metallic thin film pad 152 is coupled to non-inverting input terminal 3 of integrated circuit chip 123 by resistive film 155 and metallic pads 156. The d.c. voltage from source 24 is supplied to terminal 143 on integrated circuit chip 136 by a series circuit including wire 119, metallic pad 117, which is connected to resistive film 158, in turn connected to metallic pads 159 that are connected to pad 139; as previously indicated, pad 139 is connected by wires 142 and 144 and pad 142 to terminal 143.

The particular operational amplifier included on chip 123 is incapable of effectively providing a zero output level. To compensate for this effect, an additional operation amplifier, included in integrated circuit chip 162, is provided. Associated with integrated circuit amplifier chip 162 are resistive films 163, 164, 165, and 166, as well as integrated capacitors 167 and 168 and a diode including terminals 169 and 170, as well as additional metallic thin film connecting pads 172. In response to the voltages applied to the input terminals 2, 3, 4 and 7 of chip 162, the chip derives a plus two voltage output level on terminal 6, which voltage is coupled by wire 173 to pad 174. The plus two voltage level on pad 174 is coupled by wires 175 to pad 148, to supply cathode terminals 145 and 153 of the diodes included on chip 136 with a plus two voltage reference level. The plus two volt reference level on pads 174 is coupled by various pads and wire 176 to terminal 69, for monitoring purposes. In addition, the plus two voltage level is supplied to one terminal of resistive film 177 that forms resistor 57 in FIG. 1. Resistive film 177 is also connected to one of metallic films 91 in attenuator 11.

While there has been described and illustrated one specific embodiment of the invention, it will be clear that variations in the details of the embodiment specifically illustrated and described may be made without departing from the true spirit and scope of the invention as defined in the appended claims.

We claim:

1. A variable attenuator for a source of R.F. signal, said attenuator having an attenuation characteristic that is a function of the level of a source of d.c. control voltage, comprising a pi R.F. attenuator having shunt input and output branches between which is connected a series branch, each of said branches including a voltage controlled variable impedance PIN diode, means responsive to the control voltage for converting the level of the control voltage into a first d.c. current source having a magnitude substantially equal to $K_3 + K_2 e^{-K_1 V}$, where e is the base of natural logarithms, $K_1$, $K_2$ and $K_3$ are constants and V is the level of the control voltage, a first d.c. bias circuit for supplying the current of the first source as a d.c. bias for the diode of the series branch while isolating the d.c. current of the first source from the PIN diodes of the shunt branches, means responsive to the control voltage for converting the level of the control voltage into a second d.c. current source having a magnitude substantially equal to $K_4 + K_5 V$, where $K_4$ and $K_5$ are constants, a second d.c. bias circuit for supplying the current of the second source as d.c. biases for the diodes of both shunt branches while isolating the d.c. current of the second source from the PIN diode of the series branch.

2. The attenuator of claim 1 wherein the first bias circuit includes a series resistance for the d.c. current flowing from the first source to the diode of the series branch and a shunt resistance for the d.c. current flowing from the diode to ground, the values of the series and shunt resistances being much greater than the a.c. impedance of the diodes in the shunt branches to a.c. current flowing from the R.F. source.

3. The attenuator of claim 2 wherein the first d.c. bais circuit includes a pair of d.c. blocking capacitors in series with opposite terminals of the series branch diode.

4. The attenuator of claim 1 wherein the second d.c. bias circuit includes means for supplying the same d.c. current from the second source to the diodes of both shunt branches.

5. The attenuator of claim 4 wherein the second d.c. bias circuit includes resistance means shunting the diode of the series branch, one of said shunt branches including a blocking capacitor for preventing the d.c. current of the second source from flowing to ground through said one branch.

6. The attenuator of claim 5 wherein the resistance means has a value to set the bias current for the diodes of the shunt branches.

7. The attenuator of claim 4 wherein each of said shunt branches includes resistance means in series with the diode of the shunt branch, said resistance means having a value selected to provide a linearized R.F. db attenuation vs. control voltage level response.

8. The attenuator of claim 1 or 4 or 5 or 6 or 7 wherein the second source includes a bi-polar emitter follower transistor having base bias resistors in series with the d.c. control voltage source and connected to a d.c. collector supply source, said base bias resistors having values selected to provide a slight offset for and to linearize the current supplied by the second source to the diodes of the shunt branches.

9. The attenuator of claim 1 wherein the first source includes an operational amplifier having input and output circuits connected together by a negative feedback path, said input circuit being responsive to a d.c. current derived from the d.c. control voltage source and including a diode forward biased by the d.c. control voltage source and connected to shunt the control voltage source.

10. The attenuator of claim 9 wherein the operational amplifier includes complementary input terminals, resistor means for coupling the voltage developed across the shunt diode to one of the input terminals, another diode matched and thermally coupled to the shunt diode biased by the control voltage source so both diodes have substantially the same temperature characteristics, and resistor means for coupling the voltage developed across the another diode to the other input terminal whereby the amplifier develops an output voltage substantially equal to $K_3 + K_2 e^{-K_1 V}$ over a relatively wide temperature range.

11. The attenuator of claim 10 further including a further d.c. source for forward biasing the another diode, the further source supplying a current level to the another diode of such value as to be one factor in controlling the slope of the attenuation characteristic as a function of control voltage level.

12. The attenuator of claim 1 or 2 or 3 or 4 or 5 or 6 or 7 or 9 or 10 or 11 wherein the pi attenuator, both converting means and both bias circuits are formed on a single substrate as thin films and integrated circuit chips.

* * * * *